United States Patent
Chen et al.

(10) Patent No.: US 9,673,160 B2
(45) Date of Patent: Jun. 6, 2017

(54) PACKAGING DEVICES, METHODS OF MANUFACTURE THEREOF, AND PACKAGING METHODS

(71) Applicant: Taiwan Semiconductor Manufacturing Company, Ltd., Hsin-Chu (TW)

(72) Inventors: Hsien-Wei Chen, Hsin-Chu (TW); Tsung-Yuan Yu, Taipei (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 15/217,628

(22) Filed: Jul. 22, 2016

(65) Prior Publication Data

US 2016/0329291 A1    Nov. 10, 2016

Related U.S. Application Data

(62) Division of application No. 13/934,562, filed on Jul. 3, 2013, now Pat. No. 9,401,308.

(Continued)

(51) Int. Cl.
*H01L 23/00* (2006.01)
*H01L 25/065* (2006.01)
(Continued)

(52) U.S. Cl.
CPC ........ *H01L 24/14* (2013.01); *H01L 21/76885* (2013.01); *H01L 24/08* (2013.01);
(Continued)

(58) Field of Classification Search
CPC ............... H01L 25/043; H01L 25/0652; H01L 25/0655; H01L 25/0657; H01L 23/3128;
(Continued)

(56) References Cited

U.S. PATENT DOCUMENTS 5,072,520 A    12/1991    Nelson
5,317,801 A    6/1994    Tanaka
(Continued)

FOREIGN PATENT DOCUMENTS

DE    102005040213 A1    3/2006
DE    112005001949 T5    5/2007
(Continued)

*Primary Examiner* — Peniel M Gumedzoe
(74) *Attorney, Agent, or Firm* — Slater Matsil, LLP (57) ABSTRACT

Packaging devices, methods of manufacture thereof, and packaging methods are disclosed. In some embodiments, a packaging device includes a first substrate including a post passivation interconnect (PPI) structure including a PPI pad disposed thereon, and a second substrate including a contact pad disposed thereon. A conductive bump is coupled between the PPI pad and the contact pad. A molding material is disposed over portions of the PPI structure proximate the conductive bump. A top surface of the molding material contacts the conductive bump at a height of the conductive bump having a width C, and the contact pad has a width B. A ratio R of C:B comprises about 1.0 or greater.

20 Claims, 3 Drawing Sheets

FIG. 1, 2, or 3

Related U.S. Application Data (60) Provisional application No. 61/777,709, filed on Mar. 12, 2013.

(51) Int. Cl.
 *H01L 25/00* (2006.01)
 *H01L 21/768* (2006.01)
 *H01L 23/31* (2006.01)
 *H01L 23/525* (2006.01)

(52) U.S. Cl.
 CPC .......... *H01L 24/13* (2013.01); *H01L 25/0652* (2013.01); *H01L 25/50* (2013.01); *H01L 23/3114* (2013.01); *H01L 23/3192* (2013.01); *H01L 23/525* (2013.01); *H01L 2224/0401* (2013.01); *H01L 2224/05548* (2013.01); *H01L 2224/10126* (2013.01); *H01L 2224/1191* (2013.01); *H01L 2224/11334* (2013.01); *H01L 2224/11849* (2013.01); *H01L 2224/13005* (2013.01); *H01L 2224/13022* (2013.01); *H01L 2224/13111* (2013.01); *H01L 2224/14051* (2013.01); *H01L 2224/16238* (2013.01); *H01L 2224/81191* (2013.01); *H01L 2224/81447* (2013.01); *H01L 2225/0652* (2013.01); *H01L 2225/06517* (2013.01); *H01L 2225/06548* (2013.01); *H01L 2225/06572* (2013.01); *H01L 2924/01322* (2013.01); *H01L 2924/12042* (2013.01); *H01L 2924/15311* (2013.01); *H01L 2924/181* (2013.01)

(58) Field of Classification Search
 CPC ..... H01L 23/49816; H01L 2225/06513; H01L 2225/06517; H01L 2225/0652; H01L 2224/10125; H01L 2224/10126; H01L 2224/10155; H01L 2224/10156
 See application file for complete search history.

(56) References Cited

U.S. PATENT DOCUMENTS

| | | | |
|---|---|---|---|
| 5,869,904 A | 2/1999 | Shoji | |
| 6,037,065 A | 3/2000 | Hajmrle et al. | |
| 6,158,644 A | 12/2000 | Brofman et al. | |
| 6,187,615 B1 | 2/2001 | Kim et al. | |
| 6,365,978 B1 * | 4/2002 | Ibnabdeljalil | H01L 23/49816 257/693 |
| 6,369,451 B2 | 4/2002 | Lin | |
| 6,425,516 B1 | 7/2002 | Iwatsu et al. | |
| 6,586,322 B1 | 7/2003 | Chiu et al. | |
| 6,643,923 B1 | 11/2003 | Hishinuma et al. | |
| 6,664,637 B2 | 12/2003 | Jimarez et al. | |
| 6,933,613 B2 | 8/2005 | Akashi | |
| 6,940,169 B2 | 9/2005 | Jin et al. | |
| 7,187,068 B2 | 3/2007 | Suh et al. | |
| 7,372,151 B1 | 5/2008 | Fan et al. | |
| 7,749,882 B2 | 7/2010 | Kweon et al. | |
| 7,977,783 B1 | 7/2011 | Park et al. | |
| 8,264,089 B2 | 9/2012 | Alvarado et al. | |
| 8,345,435 B2 | 1/2013 | Hamatani et al. | |
| 8,362,612 B1 | 1/2013 | Paek et al. | |
| 8,624,392 B2 | 1/2014 | Yew et al. | |
| 8,735,273 B2 | 5/2014 | Lu et al. | |
| 2001/0050434 A1 | 12/2001 | Kaneda et al. | |
| 2002/0001937 A1 | 1/2002 | Kikuchi et al. | |
| 2002/0031868 A1 | 3/2002 | Capote et al. | |
| 2003/0068847 A1 | 4/2003 | Watanabe et al. | |
| 2003/0096453 A1 | 5/2003 | Wang et al. | |
| 2003/0153172 A1 | 8/2003 | Yajima et al. | |
| 2004/0012930 A1 | 1/2004 | Grigg | |
| 2004/0027788 A1 | 2/2004 | Chiu et al. | |
| 2004/0072387 A1 | 4/2004 | Hong et al. | |
| 2004/0266162 A1 | 12/2004 | Feng | |
| 2005/0080956 A1 | 4/2005 | Zaudtke et al. | |
| 2006/0038291 A1 | 2/2006 | Chung et al. | |
| 2006/0063378 A1 | 3/2006 | Lin et al. | |
| 2006/0189114 A1 | 8/2006 | Seto et al. | |
| 2007/0045840 A1 | 3/2007 | Varnau | |
| 2007/0102815 A1 | 5/2007 | Kaufmann et al. | |
| 2007/0108573 A1 | 5/2007 | Chung et al. | |
| 2007/0176290 A1 | 8/2007 | Park et al. | |
| 2007/0184577 A1 | 8/2007 | Chung et al. | |
| 2007/0187825 A1 | 8/2007 | Hashimoto | |
| 2007/0267745 A1 | 11/2007 | Chao et al. | |
| 2008/0001290 A1 | 1/2008 | Chou et al. | |
| 2008/0150134 A1 | 6/2008 | Shinkai et al. | |
| 2008/0308935 A1 | 12/2008 | Kim et al. | |
| 2009/0020864 A1 | 1/2009 | Pu et al. | |
| 2009/0045513 A1 | 2/2009 | Kim et al. | |
| 2009/0052218 A1 | 2/2009 | Kang | |
| 2009/0130840 A1 | 5/2009 | Wang et al. | |
| 2009/0140442 A1 | 6/2009 | Lin | |
| 2009/0140942 A1 | 6/2009 | Mikkola et al. | |
| 2009/0146317 A1 | 6/2009 | Shih | |
| 2009/0206479 A1 | 8/2009 | Daubenspeck et al. | |
| 2009/0314519 A1 | 12/2009 | Soto et al. | |
| 2010/0065966 A1 | 3/2010 | Pendse et al. | |
| 2010/0078772 A1 | 4/2010 | Robinson | |
| 2010/0096754 A1 | 4/2010 | Lee et al. | |
| 2010/0140760 A1 | 6/2010 | Tam et al. | |
| 2011/0037158 A1 | 2/2011 | Youn et al. | |
| 2011/0080713 A1 * | 4/2011 | Sunohara | H01L 23/147 361/760 |
| 2011/0101520 A1 | 5/2011 | Liu et al. | |
| 2011/0108983 A1 | 5/2011 | Lu et al. | |
| 2011/0278739 A1 | 11/2011 | Lai et al. | |
| 2011/0285008 A1 | 11/2011 | Nakano | |
| 2012/0006592 A1 | 1/2012 | Ouchi et al. | |
| 2012/0199959 A1 | 8/2012 | Hart | |
| 2012/0199991 A1 | 8/2012 | Okamoto et al. | |
| 2012/0261817 A1 | 10/2012 | Do et al. | |
| 2013/0009307 A1 | 1/2013 | Lu et al. | |
| 2013/0105971 A1 | 5/2013 | Daubenspeck et al. | |
| 2013/0147031 A1 | 6/2013 | Chen et al. | |
| 2013/0168850 A1 | 7/2013 | Samoilov et al. | |
| 2013/0181338 A1 | 7/2013 | Lu et al. | |
| 2014/0054764 A1 | 2/2014 | Lu et al. | |
| 2014/0077361 A1 | 3/2014 | Lin et al. | |
| 2014/0159223 A1 | 6/2014 | Chen et al. | |
| 2014/0187103 A1 | 7/2014 | Chen et al. | |
| 2014/0231125 A1 | 8/2014 | Chen et al. | |
| 2014/0232017 A1 | 8/2014 | Rampley et al. | |
| 2014/0252601 A1 | 9/2014 | Lu et al. | |
| 2014/0256092 A1 | 9/2014 | Kuo et al. | |
| 2014/0264846 A1 | 9/2014 | Chen et al. | |
| 2015/0014851 A1 | 1/2015 | Lu et al. | |
| 2015/0123269 A1 | 5/2015 | Chen et al. | |
| 2015/0137352 A1 | 5/2015 | Chen et al. | |
| 2015/0235977 A1 | 8/2015 | Shao et al. | |
| 2015/0243613 A1 | 8/2015 | Chen et al. | |
| 2015/0262948 A1 | 9/2015 | Lu et al. | |

FOREIGN PATENT DOCUMENTS

| | | |
|---|---|---|
| KR | 1020070076846 A | 7/2007 |
| KR | 20090018442 A | 2/2009 |
| KR | 20090120215 A | 11/2009 |
| KR | 20100131180 A | 12/2010 |
| TW | 201246540 A | 11/2012 |

* cited by examiner

PACKAGING DEVICES, METHODS OF MANUFACTURE THEREOF, AND PACKAGING METHODS

This application is a Divisional of U.S. patent application Ser. No. 13/934,562, filed on Jul. 3, 2013, entitled "Packaging Devices, Methods of Manufacture Thereof, and Packaging Methods," which claims the benefit of U.S. Provisional Application No. 61/777,709, filed on Mar. 12, 2013, and entitled "Packaging Devices, Methods of Manufacture Thereof, and Packaging Device Design Methods," which applications are incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer. The individual dies are singulated by sawing the integrated circuits along a scribe line. The individual dies are then packaged separately, in multi-chip modules, or in other types of packaging, for example.

The semiconductor industry continues to improve the integration density of various electronic components (e.g., transistors, diodes, resistors, capacitors, etc.) by continual reductions in minimum feature size, which allow more components to be integrated into a given area. These smaller electronic components such as integrated circuit dies also require smaller packages that utilize less area than packages of the past, in some applications.

One type of smaller packages for semiconductor devices that has been developed are wafer level packages (WLPs), in which integrated circuits are packaged in packages that typically include a redistribution layer (RDL) or post passivation interconnect (PPI) that is used to fan-out wiring for contact pads of the package so that electrical contacts can be made on a larger pitch than contact pads of the integrated circuit. WLPs are often used to package integrated circuits (ICs) demanding high speed, high density, and greater pin count, as examples.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of some of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Some embodiments of the present disclosure are related to packaging devices, methods of manufacture thereof, and design methods for packaging devices for semiconductor devices. Novel packaging devices will be described herein that have an optimized amount of molding thickness and optimized contact pad widths that reduce stress and strain on conductive bumps of the packaging devices, resulting in packages with improved reliability.

Figure 1:
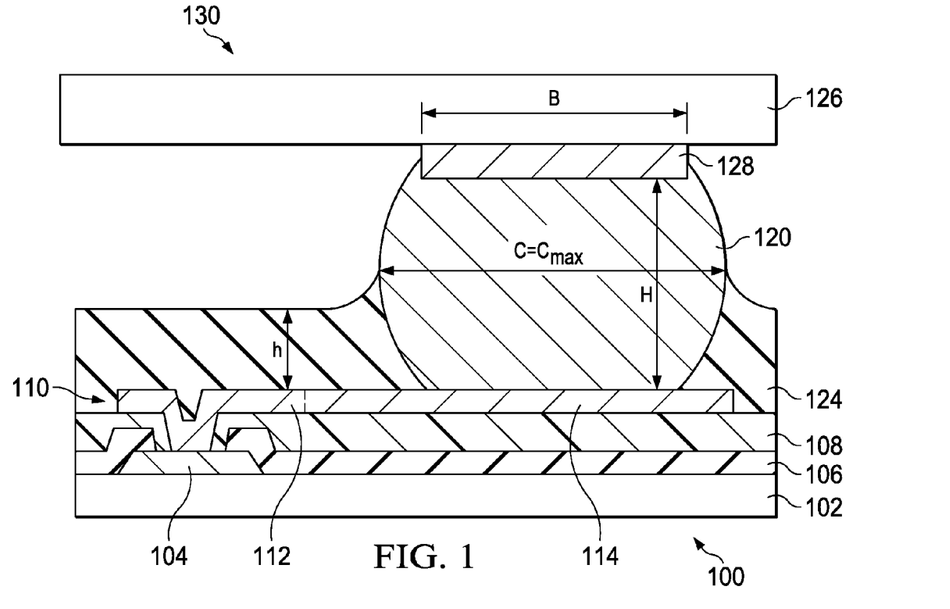
FIG. 1 is a cross-sectional view illustrating a portion of a packaging device in accordance with some embodiments of the present disclosure.

FIG. 1 is a cross-sectional view illustrating a portion 130 of a packaging device in accordance with some embodiments of the present disclosure. The packaging device comprises a WLP 100 in some embodiments. The packaging device includes a first substrate 102 and a second substrate 126 coupled to the first substrate 102 by a conductive bump 120. Only one conductive bump 120 is shown; however, in some embodiments, the packaging device includes a plurality of the conductive bumps 120 (see FIG. 4). A width B of contact pads 128 disposed on the second substrate 126 and a thickness h of a molding material 124 disposed on the first substrate 102 are optimized in accordance with some embodiments of the present disclosure, in order to reduce stress on the conductive bump 120 and other portions of the packaging device, to be described further herein.

To manufacture the packaging device, the first substrate 102 is provided. The first substrate 102 may comprise silicon, other types of bulk semiconductor material, or other materials, as examples. The first substrate 102 may include one or more integrated circuits formed thereon, not shown. The first substrate 102 comprises a plurality of integrated circuit regions in some embodiments, for example. The integrated circuit regions may contain active and passive devices, conductive layers, and dielectric layers according to the electrical design of the integrated circuits, as examples.

A plurality of packaging devices is formed across the surface of the first substrate 102 in accordance with some embodiments. The packaging devices are formed over the first substrate 102 when the first substrate 102 is in a wafer form, for example. The packaging devices are later singulated to form individual packaging devices, e.g., before or after the packaging devices are used to package integrated circuit dies.

A conductive layer is formed over the first substrate 102 as a contact pad 104 using a patterning and deposition process over the first substrate 102. The contact pad 104 may comprise aluminum (Al), copper (Cu), tin (Sn), nickel (Ni), gold (Au), silver (Ag), other electrically conductive materials, or multiple layers or combinations thereof, as examples. The contact pad 104 may be formed using an electrolytic plating or electro-less plating process, for example. A plurality of the contact pads 104 (not shown) are formed over the surface of the first substrate 102, and the contact pads 104 may be of the same size or of different sizes.

A passivation layer 106 may be formed over the surface of the first substrate 102 and over the top surface of the contact pad 104 and first substrate 102 for structural support and physical isolation. The passivation layer 106 comprises silicon nitride (SiN), silicon dioxide ($SiO_2$), silicon oxynitride (SiON), polyimide (PI), benzocyclobutene (BCB), polybenzoxazole (PBO), other insulating materials, or combinations or multiple layers thereof, as examples. An opening in the passivation layer 106 may be made by removing a portion of passivation layer 106 using a mask-defined photoresist etching process to expose a portion of the contact pad 104, while leaving another portion of the contact pad 104 covered.

A polymer layer 108 may be formed on the passivation layer 106, following the contour of the passivation layer 106 and filling a part of the opening of the passivation layer 106 over the contact pad 104. The polymer layer 108 may not completely fill the opening of the passivation layer 106 over the contact pad 104; rather, it may be patterned to form an opening to expose a portion of the contact pad 104, while covering other portions of the contact pad 104. The patterning of the polymer layer 108 may include photolithography techniques. The polymer layer 108 may be formed of a polymer, such as an epoxy, polyimide, benzocyclobutene (BCB), polybenzoxazole (PBO), and the like, although other relatively soft, often organic, dielectric materials may also be used. Spin coating or other commonly used formation methods may be used to apply the polymer layer 108. The thickness of the polymer layer 108 may be between about 5 μm and about 30 μm, for example. Alternatively, the polymer layer 108 may comprise other dimensions.

A conductive material such as a metal is used to form interconnect wiring 110 over the polymer layer 108, following the contour of the polymer layer 108. The interconnect wiring 110 comprises a post-passivation interconnect (PPI) structure in some embodiments. The PPI structure 110 includes a PPI line 112 and a PPI pad 114 which are disposed over the polymer layer 108. The PPI line 112 and PPI pad 114 may have a thickness of less than about 30 μm, and may comprise a thickness of about 2 μm to about 10 μm in some embodiments, as examples. The PPI line 112 and PPI pad 114 may comprise a metal such as Ti, Al, Ni, nickel vanadium (NiV), Cu, or combinations or multiple layers thereof, as examples. The PPI line 112 and PPI pad 114 may be formed using electrolytic plating, electro-less plating, sputtering, chemical vapor deposition (CVD) methods, and/or photolithography processes, for example. The PPI line 112 and PPI pad 114 may comprise a single layer or multiple layers using an adhesion layer of Ti, TiW, Cr, or other materials, for example. Alternatively, the PPI line 112 and PPI pad 114 may comprise other materials and dimensions, and may be formed using other methods. The first substrate 102 is connected to a number of PPI lines 112 and PPI pads 114 to form a PPI structure 110 comprising a network (not shown) of PPI lines 112 and PPI pads 114, which may electrically connect to the contact pads 104 of the first substrate 102, for example.

In some embodiments, a blanket coating of conductive material may be formed over the polymer layer 108 and the exposed portion of the contact pad 104, and the conductive material is patterned using lithography, e.g., by forming a layer of photoresist (not shown) over the conductive material, patterning the photoresist, and using the photoresist as an etch mask during an etch process for the conductive material, forming the conductive material into the desired patterns and shapes of the PPI lines 112 and PPI pads 114. The layer of photoresist is then removed. In other embodiments, a seed layer (also not shown) is formed over the polymer layer 108 and exposed portion of the contact pad 104, and a layer of photoresist is formed over the seed layer. The photoresist is patterned with the desired patterns and shapes of the PPI lines 112 and PPI pads 114. The conductive material is then plated onto the seed layer through the patterns in the photoresist. The photoresist is removed, and the seed layer is removed from over the polymer layer 108. Alternatively, other methods may be used to form the PPI lines 112 and PPI pads 114. In some embodiments, the PPI lines 112 and PPI pads 114 are simultaneously formed and are integral to one another; e.g., the PPI lines 112 and PPI pads 114 are formed from a single piece of conductive material.

Only one PPI line 112 and PPI pad 114 are shown in the drawings; however, a plurality of PPI lines 112 and PPI pads 114 are formed across a surface of the packaging device and are used for making electrical connections to a plurality of contact pads 104 disposed over the first substrate 102. The PPI lines 112 and PPI pads 114 comprise a redistribution layer (RDL), post-passivation interconnect structure 110, or other interconnect routing structure of the packaging device in some embodiments, for example.

The PPI line 112 is a conductive line that extends over the underlying contact pad 104. The PPI line 112 fills an opening in the polymer layer 108 and the passivation layer 106 and forms an electrical connection with the contact pad 104. The PPI line 112 contacts the PPI pad 114. The PPI line 112 may have a narrow, wide, or tapered shape. The PPI line 112 may comprise a substantially constant thickness and width. The PPI line 112 terminates at the PPI pad 114; therefore, the bodies of the PPI line 112 and the PPI pad 114 may be formed as one piece.

A solder flux (not shown) may be applied to the PPI line 112 and PPI pad 114 in some embodiments to assist in the flow of the solder, such that a subsequently formed conductive bump 120 makes good physical and electrical contact with the PPI pad 114. The flux may be applied by brushing, spraying, a stencil, or other methods, as examples. The flux generally has an acidic component that removes oxide barriers from the solder surfaces, and an adhesive quality that helps to prevent an integrated circuit or other device from moving on the first substrate 102 surface during the packaging process using the packaging device.

A conductive bump 120 is formed over the PPI pad 114. The PPI pad 114 is used to connect to the conductive bump 120, forming a connection between the contact pad 104 to the conductive bump 120 by way of the PPI line 112 and the PPI pad 114. The conductive bump 120 may have a larger diameter or width C than the diameter or width of the PPI pad 114.

The conductive bump 120 comprises a eutectic material and may comprise a solder bump or a solder ball in some embodiments, as examples. The use of the word "solder" herein includes both lead-based and lead-free solders, such as Pb—Sn compositions for lead-based solder; lead-free solders including InSb; tin, silver, and copper ("SAC") compositions; and other eutectic materials that have a common melting point and form conductive solder connections in electrical applications. For lead-free solder, SAC solders of varying compositions may be used, such as SAC 105 (Sn 98.5%, Ag 1.0%, Cu 0.5%), SAC 305, and SAC 405, as examples. Lead-free conductive bumps 120 such as solder balls may be formed from SnCu compounds as well, without the use of silver (Ag). Alternatively, lead-free solder connectors may include tin and silver, Sn—Ag, without the use of copper. The conductive bump 120 may be one among an array of the conductive bumps 120 formed as a grid, often referred to as a ball grid array (BGA). The conductive bumps 120 may alternatively be arranged in other shapes and configurations. The conductive bumps 120 may comprise spherical conductive connectors and may also comprise non-spherical conductive connectors, for example.

Referring again to FIG. 1, the conductive bump 120 is attached in some embodiments using a solder ball drop process. The conductive bump 120 is mounted onto the PPI pad 114, and the eutectic material of the conductive bump 120 is re-flowed to attach the conductive bump 120 to the PPI pad 114.

A molding material 124 is formed over the PPI line 112, PPI pad 114, conductive bump 120, and exposed portions of the polymer layer 108 in some embodiments. The molding material 124 comprises a molding compound and may comprise epoxy, an organic polymer, or a polymer with a silica-based filler added, as examples. In some embodiments, the molding material 124 comprises a liquid molding compound (LMC) that is a gel-type liquid when applied. Alternatively, the molding material 124 may comprise other insulating materials. The molding material 124 extends over a top surface of the conductive bump 120 after applying the molding material 124 in some embodiments, and a top portion of the molding material 124 is then recessed so that a top portion of the conductive bump 120 is exposed. After the molding material 124 is applied, the molding material 124 is cured. In some embodiments, the molding material 124 shrinks during the curing process, which partially recesses the molding material 124. Additional molding material 124 is removed in some embodiments using a plasma treatment process or other type of process, to remove the molding material 124 from the conductive bump 120 to expose the conductive bump 120, for example. In other embodiments, the molding material 124 after curing does not require an additional processing step to recess the molding material 124, as another example.

Due to a meniscus effect in some embodiments, the molding material 124 is thicker proximate the conductive bump 120, as illustrated in FIG. 1. In other embodiments, the molding material 124 comprises substantially the same thickness h across the surface of the substrate 102, not shown in the drawings.

In some embodiments, the molding material 124 is formed over the PPI line 112, PPI pad 114, and exposed portions of the polymer layer 108 before the conductive bump 120 is coupled to the PPI pad 114. The molding material 124 is then cured, and openings are formed in the molding material 124 to expose at least portions of the PPI pad 114. The openings can be formed in the molding material 124 using a drilling process, such as a laser drilling process, by a photolithography process, or a direct patterning process of the molding material 124, as examples. Alternatively, the molding material 124 may be patterned using other methods to form the opening over the PPI pad 114. The conductive bump 120 is then coupled to the PPI pad 114 through the opening in the molding material 124.

A second substrate 126 is also provided. The second substrate 126 comprises a printed circuit board (PCB) in some embodiments. Alternatively, the second substrate 126 may comprise other types of substrates. The second substrate 126 includes a plurality of contact pads 128 coupled thereto or formed thereon, as shown in FIG. 1. The contact pads 128 may comprise Cu, Cu alloys, other metals, or multiple layers or combinations thereof, as examples. Alternatively, the contact pads 128 may comprise other materials. Each contact pad 128 comprises a width comprising dimension B.

A top surface of the molding material 124 contacts the conductive bump 120 at a height of the conductive bump 120 having a diameter or width comprising dimension C. Dimension C comprises a confined bump 120 diameter or width; for example, dimension C comprises a diameter or width of an upper-most portion of the conductive bump 120 that is confined by the molding material 124. In some embodiments, dimension C comprises a width of the conductive bump 120, e.g., in embodiments wherein the conductive bump 120 comprises a non-spherical connector.

The first substrate 102 is attached to the second substrate 126, as shown in FIG. 1. Each conductive bump 120 on the first substrate 102 is attached to one of the contact pads 128 on the second substrate 126. A ratio R of C:B comprises about 1.0 or greater in some embodiments.

In some embodiments, the conductive bump 120 comprises a shape of a partial conductive ball that is flat on a side coupled to the PPI pad 114 and substantially spherical on other surfaces, before attaching the conductive bump 120 to one of the contact pads 128 on the second substrate 126. After attaching the conductive bump 120 to one of the contact pads 128, the conductive bump 120 comprises two flat sides, one coupled to the PPI pad 114 and the other coupled to the contact pad 128, as illustrated in FIG. 1. The other surfaces of the conductive bump 120 (e.g., the sides of the conductive bump 120) may be substantially spherical or curved in some embodiments, as shown in FIG. 1. Alternatively, the other surfaces of the conductive bump 120 may be barrel-shaped, substantially straight, or may comprise other shapes, in accordance with some embodiments of the present disclosure.

The amount of molding material 124 (e.g., the thickness h of the molding material 124) is controlled or adjusted to achieve the ratio R of C:B comprising about 1.0 or greater, in some embodiments. In other embodiments, the width B of the contact pad 128 on the second substrate 126 is controlled or adjusted to achieve the ratio R of C:B comprising about 1.0 or greater. In some embodiments, the width B of the contact pad 128 on the second substrate 126 is chosen or selected to achieve the ratio R of C:B comprising about 1.0 or greater. In some embodiments, both the thickness h of the molding material 124 is controlled or adjusted, and also the width B of the contact pad 128 is chosen or selected, that achieves the ratio R of C:B comprising about 1.0 or greater, for example.

The contact pad 128 on the second substrate 126 comprises a width B of about 150 µm to about 300 µm in some embodiments. The diameter or width C of the conductive bump 120 comprises about 150 µm to about 300 µm in some embodiments. Alternatively, the width B of the contact pad 128 and the diameter or width C of the conductive bump 120 may comprise other dimensions or other relative dimensions.

The thickness h of the molding material 124 comprises about 50 µm to about 250 µm in some embodiments. A stand-off height H of the conductive bump 120 between the contact pad 128 on the second substrate 126 and the PPI pad 114 on the first substrate 102 comprises about 150 µm to about 250 µm in some embodiments. The thickness h of the molding material 124 is equal to about (½*H) in the embodiments shown in FIG. 1, for example. In some embodiments, the diameter or width C of the conductive bump 120 comprises a maximum diameter or width $C_{max}$ of the conductive bump 120, as illustrated in FIG. 1. In these embodiments, the ratio R of C:B may be about 1.3 or greater, for example.

In some embodiments, the thickness h of the molding material 124 is less than or greater than about (½*H). In other embodiments, the molding material 124 thickness h ranges from about (⅓*H) to about (⅔*H), as another example. In other embodiments, the molding material 124 thickness h is greater than about (⅔*H) or less than about (⅓*H).

Figure 2:
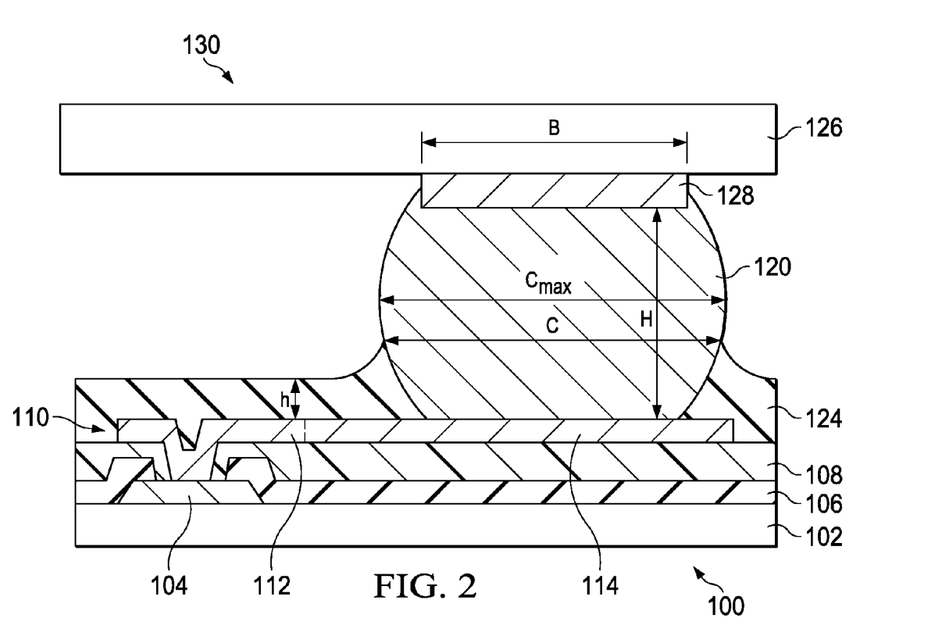
FIG. 2 is a cross-sectional view illustrating a portion of a packaging device in accordance with other embodiments of the present disclosure.

For example, FIG. 2 is a cross-sectional view illustrating a portion 130 of a packaging device in accordance with some embodiments of the present disclosure, wherein the molding material 124 comprises a thickness h that is less than about (½*H). A top surface of the molding material 124 contacts the conductive bump 120 at a height of the conductive bump 120 having a diameter or width comprising dimension C, wherein dimension C is less than the maximum diameter or width $C_{max}$ of the conductive bump 120. In some embodiments, a width B of the contact pad 128 on the second substrate 126 can be selected to achieve a ratio of C:B of greater than or equal to 1.0, based on the thickness h of the molding material 124 that creates the confined bump diameter or width C of the conductive bump 120. The molding material 124 may comprise a thickness h of about (⅓*H) to less than about (½*H) in some embodiments. Alternatively, the molding material 124 may comprise a thickness h of less than about (⅓*H), in other embodiments.

Figure 3:
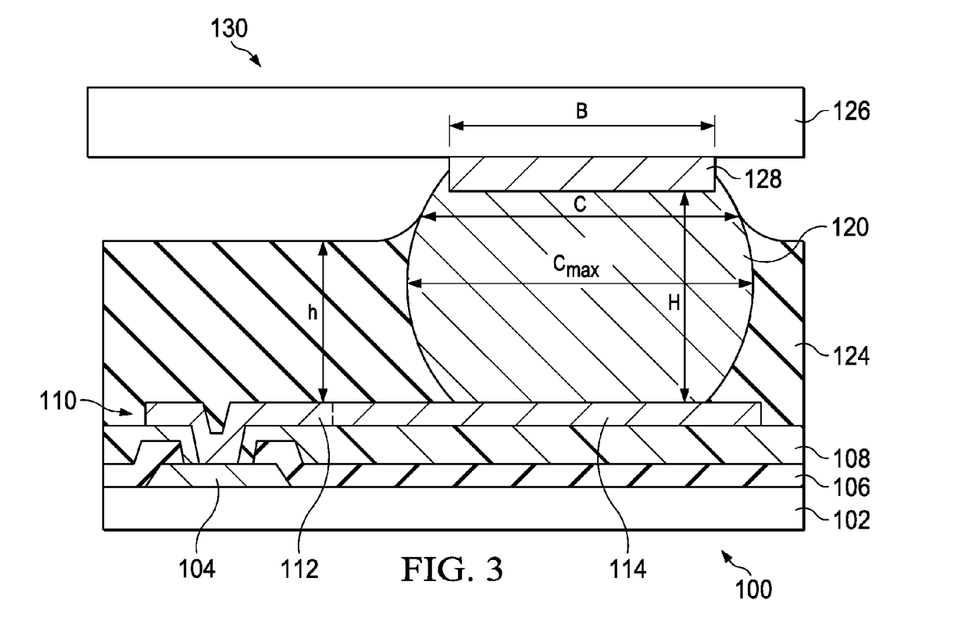
FIG. 3 is a cross-sectional view illustrating a portion of a packaging device in accordance with yet other embodiments of the present disclosure.

FIG. 3 is a cross-sectional view illustrating a portion 130 of a packaging device in accordance with yet other embodiments of the present disclosure, wherein the molding material 124 comprises a thickness that is greater than about (½*H). A top surface of the molding material 124 contacts the conductive bump 120 at a height of the conductive bump 120 comprising a diameter or width comprising dimension C, wherein dimension C is less than the maximum diameter or width $C_{max}$ of the conductive bump 120. In some embodiments, a width B of the contact pad 128 on the second substrate 126 can be selected to achieve a ratio of C:B of greater than or equal to 1.0, based on the thickness h of the molding material 124 that creates the confined bump diameter or width C of the conductive bump 120. The molding material 124 may comprise a thickness h of greater than about (½*H) to about (⅔*H) in some embodiments. Alternatively, the molding material 124 may comprise a thickness h of greater than about (⅔*H), in other embodiments.

Figure 4:
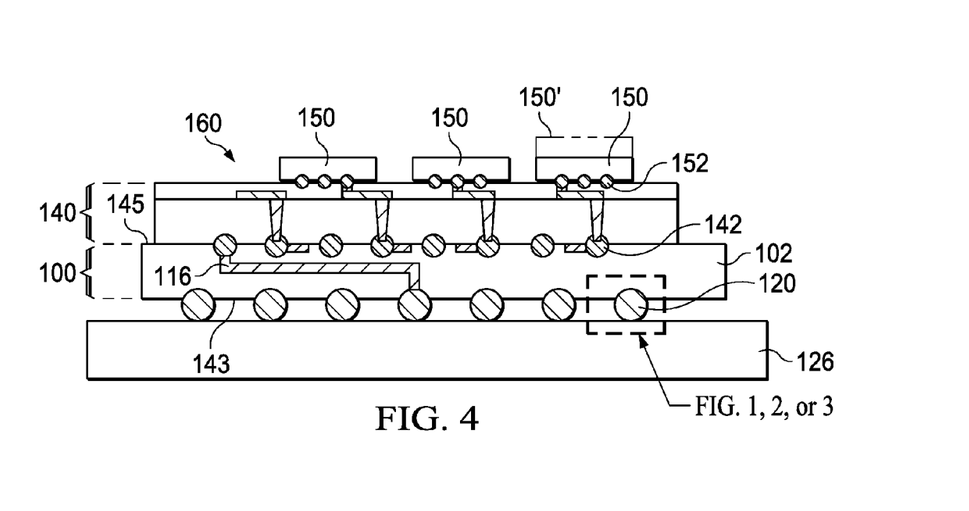
FIG. 4 is a cross-sectional view of a packaging device including the portions of the packaging devices shown in FIGS. 1, 2, and 3 in accordance with some embodiments.

FIG. 4 is a cross-sectional view of a packaging device including the portions 130 of the packaging devices shown in FIGS. 1, 2, and 3 in accordance with some embodiments. FIG. 4 illustrates the implementation of the portions 130 of the packaging devices shown in FIGS. 1, 2, and 3 in a completed packaged semiconductor device 160. The portions of the packaging devices shown in FIGS. 1, 2, and 3 are inverted with respect to the view shown in FIG. 4.

The PPI structure 110 (not shown in FIG. 4; see FIG. 1, 2, or 3) disposed over the first substrate 102 comprises a PPI structure comprising a plurality of the PPI pads, and the second substrate 126 includes a plurality of the contact pads 128 (also not shown in FIG. 4; see FIG. 1, 2, or 3). A plurality of the conductive bumps 120 is coupled between the first substrate 102 and the second substrate 126, as shown in FIG. 4. Only seven conductive bumps 120 are shown in FIG. 4; however, in some embodiments, dozens or hundreds of conductive bumps 120 may be coupled between the substrates 102 and 126, depending on the application. Each of the plurality of conductive bumps 120 is coupled between one of the plurality of PPI pads 114 and one of the plurality of contact pads 128.

In some embodiments, the PPI structure 110 is formed on a first side 143 of the first substrate 102, and the second substrate 126 is coupled to the PPI structure 110 on the first side 143 of the first substrate 102. A third substrate 140 is coupled to a second side 145 of the first substrate 102, the second side 145 of the first substrate 102 being opposite the first side 143 of the first substrate 102, as shown in FIG. 4. At least one integrated circuit die 150 is coupled to the third substrate 140. In some embodiments, a plurality of the integrated circuit dies 150 to the third substrate. The integrated circuit dies 150 may be coupled horizontally across the surface of the third substrate 140. Alternatively, a plurality of the integrated circuit dies 150 may be coupled vertically over one another, as shown in phantom (e.g., in dashed lines) at 150'.

The third substrate 140 comprises an interposer in some embodiments. The third substrate 140 comprising the interposer includes one or more RDLs and through-substrate vias formed thereon, for example. The third substrate 140 is coupled to the first substrate 102 by a plurality of controlled collapse chip connection (C4) bumps 142, and the integrated circuit die or dies 150 are coupled to the third substrate 140 by a plurality of microbumps 152 in some embodiments. Alternatively, the first substrate 102, the second substrate 126, and the third substrate 140 may comprise other types of substrates, and other types of connections 142 and 152 may be used to couple together the dies 150 and third substrate 140 or the first substrate 102 and the third substrate 140, for example. In some embodiments, the packaged semiconductor device 160 comprises a chip-on-wafer-on-substrate (Co-WoS) package that is coupled to a second substrate 126 comprising a PCB, for example.

Some embodiments of the present disclosure comprise methods of designing packaging devices for semiconductor devices. Referring again to FIG. 1, 2, or 3, the design methods include providing a first substrate 102 having a PPI structure 110 disposed thereon, the PPI structure 110 including a PPI pad 114. A width B of a contact pad 128 on a second substrate 126 is determined, the contact pad 128 being coupleable to the PPI pad 114 on the first substrate 102 by a conductive bump 120. A thickness h of a molding material 124 to be disposed over the PPI structure 110 proximate the conductive bump 120 is determined. When the molding material 124 is disposed over the PPI structure 110, a top surface of the molding material 124 is determined to contact the conductive bump 120 at a height of the conductive bump 120 having a diameter or width C. The height of the conductive bump 120 having the diameter or width C is slightly greater than thickness h of the molding material 124 in some embodiments. The height of the conductive bump 120 having the diameter or width C is slightly greater than thickness h of the molding material 124 by a few μm in some embodiments, for example. In other embodiments, the height of the conductive bump 120 having the diameter or width C is substantially equal to dimension h, for example.

The design method includes selecting the width B of the contact pad 128, adjusting the thickness h of the molding material 124, or selecting both the width B of the contact pad 128 and adjusting the thickness h of the molding material 124 to achieve a ratio R of the diameter or width C of the conductive bump to the width B of the contact pad (C:B) of about 1.0 or greater. Advantageously, selecting the width B of the contact pad and/or adjusting the thickness of the molding material to achieve the ratio R of about 1.0 or greater reduces an amount of stress on the conductive bump 120, improving the reliability of the packaged semiconductor device 160.

In some embodiments, ratio R comprises about 1.3 or greater. In other embodiments, ratio R comprises about 1.0 to about 1.3. In yet other embodiments, ratio R comprises about 1.1 to about 1.2, as another example.

Figure 5:
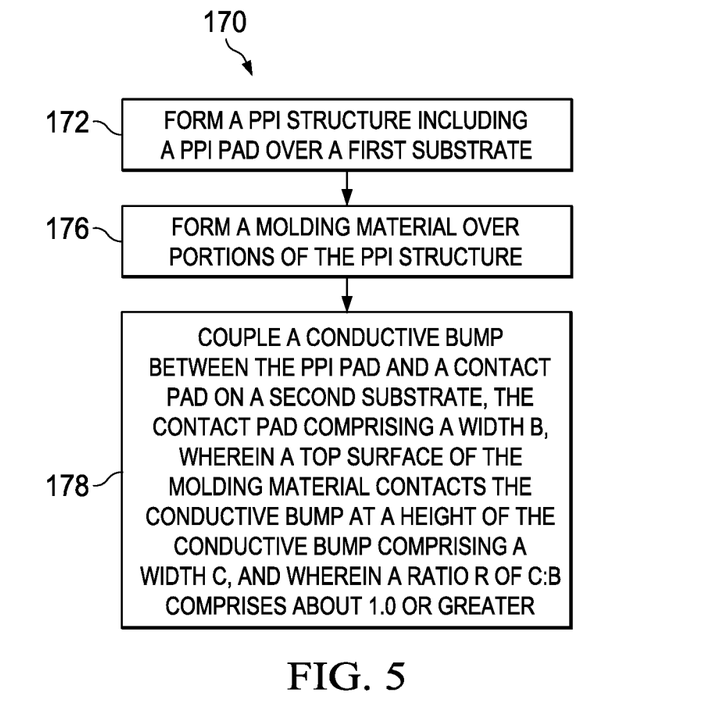
FIG. 5 is a flow chart illustrating a method of manufacturing a packaging device in accordance with some embodiments.

FIG. 5 is a flow chart 170 illustrating a method of manufacturing a packaging device in accordance with some embodiments of the present disclosure. Referring also to FIG. 1, in step 172, a PPI structure 110 including a PPI pad 114 is formed over a first substrate 102. In step 176, a molding material 124 is formed over portions of the PPI structure. In step 178, a conductive bump 120 is coupled between the PPI pad 114 and a contact pad 128 on a second substrate 126. The contact pad comprises a width B. A top surface of the molding material 124 contacts the conductive bump 120 at a height of the conductive bump 120 comprising a width C. A ratio R of C:B comprises about 1.0 or greater.

Some embodiments of the present disclosure include methods of manufacturing packaging devices, and also include packaging devices manufactured using the methods described herein. Other embodiments include design methods for packaging devices, and methods of packaging semiconductor devices.

Advantages of some embodiments of the disclosure include providing novel packaging devices that have improved reliability, due to the optimized dimensions of various elements of the packaging devices. Methodologies for improving low cost wafer level packaging reliability are disclosed by embodiments of the present disclosure.

An under-ball metallization (UBM) structure is not included in the first substrates 102, which provides a cost savings. A ratio between the contact pad 128 size and a conductive bump 120 diameter or width C that is in contact with the molding material 124 is optimized, which minimizes strain on the conductive bump 120 and furthermore, reduces stress on insulating material layers of the first substrate 102, which may comprise extra low dielectric constant (ELK) materials having a dielectric constant less than a dielectric constant of silicon dioxide in some embodiments, for example. The reduced amount of accumulated strain on the conductive bumps 120 results in a significant increase in bump fatigue life in some embodiments, for example. The accumulated strain on the conductive bumps 120 can be reduced by about 34% in some embodiments by tuning the molding material 124 thickness and controlling ratio R to a value of about 1.0 or greater. Alternatively, the accumulated strain may be reduced by other amounts.

The packaging devices comprise ultra-low cost wafer level chip scale package (WLCSP) schemes and manufacturing processes in some embodiments that provide a reliability improvement. The novel packaging device structures and designs are easily implementable in manufacturing process flows. The manufacturing methods for the packaging devices can be implemented with no additional cost, and ensure a robust wafer level packaging scheme.

In accordance with some embodiments of the present disclosure, a packaging device includes a first substrate including a PPI structure including a PPI pad disposed thereon, and a second substrate including a contact pad disposed thereon. A conductive bump is coupled between the PPI pad and the contact pad. A molding material is disposed over portions of the PPI structure proximate the conductive bump. A top surface of the molding material contacts the conductive bump at a height of the conductive bump comprising a width C, and the contact pad comprises a width B. A ratio R of C:B comprises about 1.0 or greater.

In accordance with other embodiments, a method of manufacturing a packaging device includes forming a PPI structure including a PPI pad over a first substrate. A molding material is formed over portions of the PPI structure, and a conductive bump is coupled between the PPI pad and a contact pad on a second substrate. A top surface of the molding material contacts the conductive bump at a height of the conductive bump comprising a width C. The contact pad comprises a width B. A ratio R of C:B comprises about 1.0 or greater.

In accordance with other embodiments, a method of manufacturing a packaging device includes forming a first contact pad over a first substrate, and forming a polymer layer over the first contact pad and the first substrate. An opening is formed in the polymer layer over a portion of the first contact pad, and a PPI structure including a PPI pad and a PPI line is formed over the polymer layer, a portion of the PPI line being coupled to the first contact pad. A molding material is formed over portions of the PPI structure, and a conductive bump is coupled between the PPI pad and a second contact pad on a second substrate. A top surface of the molding material contacts the conductive bump at a height of the conductive bump comprising a width C, and the second contact pad comprises a width B. A ratio R of C:B comprises about 1.0 or greater.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A packaging device comprising:
    a first substrate including a post passivation interconnect (PPI) structure including a PPI pad disposed thereon, the PPI structure being on a first side of the first substrate;
    a second substrate including a contact pad disposed thereon;
    a conductive bump coupled between the PPI pad and the contact pad, the conductive bump being a solder bump;
    a molding material disposed over portions of the PPI structure proximate the conductive bump, wherein a top surface of the molding material contacts the conductive bump at a height of the conductive bump comprising a width C, wherein the contact pad comprises a width B, and wherein a ratio R of C:B comprises about 1.0 or greater;

a third substrate coupled to a second side of the first substrate using a plurality of controlled collapse chip connection (C4) bumps, the C4 bumps having a different size than the solder bump, the second side of the first substrate being opposite the first side of the first substrate; and an integrated circuit die coupled to the third substrate using a plurality of microbumps, the plurality of microbumps having a different size than the C4 bumps and the solder bump.

2. The packaging device according to claim 1, wherein the conductive bump comprises a stand-off height H between the contact pad and the PPI pad, and wherein a thickness h of the molding material comprises about ($\frac{1}{2}$*H).

3. The packaging device according to claim 2, wherein the width C of the conductive bump comprises a maximum diameter or width $C_{max}$ of the conductive bump.

4. The packaging device according to claim 3, wherein the ratio R of C:B comprises about 1.3 or greater.

5. The packaging device according to claim 1, wherein the conductive bump comprises a stand-off height H between the contact pad and the PPI pad, and wherein a thickness h of the molding material is less than or greater than about ($\frac{1}{2}$*H).

6. The packaging device according to claim 5, wherein the thickness h of the molding material comprises about ($\frac{1}{3}$*H) to (about $\frac{2}{3}$*H).

7. The packaging device according to claim 1, wherein the contact pad on the second substrate comprises a width B of about 150 µm to about 300 µm.

8. The packaging device according to claim 1, wherein the width C of the conductive bump comprises about 150 µm to about 300 µm.

9. The packaging device according to claim 1, wherein the molding material comprises a thickness of about 50 µm to about 250 µm.

10. The packaging device according to claim 1, wherein a stand-off height H of the conductive bump between the contact pad and the PPI pad comprises about 150 µm to about 250 µm.

11. A structure comprising:
a post passivation interconnect (PPI) structure including a PPI pad over a first substrate, the PPI structure being on a first side of the first substrate;
a molding material over and in physical contact with a first conductive portion of the PPI structure;
a second substrate comprising a contact pad;
a solder bump coupling the PPI pad of the first substrate and the contact pad of the second substrate, wherein a top surface of the molding material contacts the solder bump at a height of the solder bump having a width C, wherein the contact pad has a width B, and wherein a ratio R of C:B is about 1.0 or greater;
a third substrate coupled to a second side of the first substrate using a plurality of controlled collapse chip connection (C4) bumps with a different size than the solder bump, the second side of the first substrate being opposite the first side of the first substrate; and
an integrated circuit die coupled to the third substrate using a plurality of microbumps with a different size than the C4 bumps and the solder bump.

12. The structure of claim 11, wherein the solder bump is laterally separated from the first conductive portion of the PPI structure.

13. The structure of claim 11 further comprising a plurality of the integrated circuit dies coupled to the third substrate.

14. The structure of claim 11, wherein the molding material distal the conductive bump has a thickness h, wherein the solder bump has a stand-off height H between the contact pad and the PPI pad, and wherein the thickness h of the molding material is greater than about ($\frac{1}{2}$*H).

15. The structure of claim 14, wherein the thickness h of the molding material is greater than ($\frac{2}{3}$*H).

16. The structure of claim 11, wherein the microbumps have a smaller size than the C4 bumps and the solder bump.

17. The structure of claim 11, wherein the width C of the solder bump comprises a maximum diameter of the solder bump.

18. A structure comprising:
a first contact pad on a first side of a first substrate;
a post passivation interconnect (PPI) structure over the first contact pad and the first substrate, a portion of the PPI structure being coupled to the first contact pad;
a conductive bump on the PPI structure;
a molding material over portions of the PPI structure and surrounding at least a lower portion of the conductive bump, wherein a top surface of the molding material contacts the conductive bump at a first height of the conductive bump having a width C, wherein the molding material distal the conductive bump has a thickness h, the thickness h being less than the first height;
a second substrate coupled to the first substrate using the conductive bump, the conductive bump being coupled between the PPI structure and a second contact pad disposed on the second substrate, wherein the second contact pad has a width B, and wherein a ratio R of C:B is about 1.0 or greater, wherein the conductive bump has a stand-off height H between the second contact pad and the PPI structure, and wherein the thickness h of the molding material is greater than ($\frac{1}{3}$*H);
a third substrate coupled to a second side of the first substrate using a plurality of controlled collapse chip connection (C4) bumps with a different size than the conductive bump, the second side of the first substrate being opposite the first side of the first substrate; and
an integrated circuit die coupled to the third substrate using a plurality of microbumps with a different size than the C4 bumps and the conductive bump.

19. The structure of claim 18, wherein the thickness h of the molding material is measured from a top surface of the PPI structure and wherein the molding material comprises a single material throughout the molding material.

20. The structure of claim 18, wherein the microbumps have a smaller size than the C4 bumps and the conductive bump.

* * * * *